US012660377B2

(12) United States Patent　　(10) Patent No.: US 12,660,377 B2
D'Arrigo et al.　　(45) Date of Patent: Jun. 16, 2026

(54) LIGHT-EMITTER DEVICE WITH INDUCED DEFECTS AND METHOD OF MANUFACTURING THE LIGHT EMITTER DEVICE

(71) Applicant: STMICROELECTRONICS S.r.l., Agrate Brianza (IT)

(72) Inventors: Giuseppe D'Arrigo, San Giovanni la Punta (IT); Antonella Sciuto, San Giovanni la Punta (IT); Domenico Pierpaolo Mello, Catania (IT); Pietro Paolo Barbarino, Belpasso (IT); Salvatore Coffa, Milan (IT)

( * ) Notice: Subject to any disclaimer, the term of this patent is extended or adjusted under 35 U.S.C. 154(b) by 419 days.

(21) Appl. No.: 18/504,034

(22) Filed: Nov. 7, 2023

(65) Prior Publication Data

US 2024/0162371 A1　　May 16, 2024

(30) Foreign Application Priority Data

Nov. 15, 2022　(IT) ........................ 102022000023526

(51) Int. Cl.
H10H 20/81　　(2025.01)
(52) U.S. Cl.
CPC .............................. H10H 20/8215 (2025.01)
(58) Field of Classification Search
CPC .................................................. H10H 20/8215
See application file for complete search history.

(56) References Cited

U.S. PATENT DOCUMENTS

| 3,320,568 A * | 5/1967 | Russell .................. H10D 99/00 |
| | | 257/586 |
| 2007/0263690 A1 | 11/2007 | Homewood et al. |
| 2014/0339398 A1 | 11/2014 | Mazzillo et al. |

(Continued)

FOREIGN PATENT DOCUMENTS

EP　　　　1727213 A2　　11/2006

OTHER PUBLICATIONS

Fuchs et al., "Silicon carbide light-emitting diode as a prospective room temperature source for single photons," *Scientific Reports* 3:1637, published Apr. 10, 2013, 4 pages.

(Continued)

*Primary Examiner* — Peter M Albrecht
(74) *Attorney, Agent, or Firm* — Seed Intellectual Property Law Group LLP

(57)　　　　ABSTRACT

A light-emitter device comprising: a body of solid-state material; and a P-N junction in the body, including: a cathode region, having N-type conductivity; an anode region, having P-type conductivity, extending in direct contact with the cathode region and defining a light-emitting surface; and a depletion region around an interface between the anode and the cathode regions. The light-emitting surface has at least one indentation that extends towards the depletion region. The depletion region has a peak defectiveness area, housing irregularities in crystal lattice, in correspondence of said at least one indentation. The defectiveness area, which includes point defects, line defects, bulk defects, etc., is generated as a direct consequence of the formation of (Continued)

the indentation by an indenter or nanoindenter system. In the defectiveness area color centers are generated.

19 Claims, 4 Drawing Sheets

(56) References Cited

U.S. PATENT DOCUMENTS

2020/0028001 A1    1/2020   Mazzillo et al.
2022/0336701 A1   10/2022   Holland

OTHER PUBLICATIONS

Khramtsov et al., "Enhancing the brightness of electrically driven single-photon sources using color centers in silicon carbide," *NPJ Quantum Information* 15, published Feb. 21, 2018, 8 pages.
Pellegrino et al., "Correlation between Defects and Electrical Performances of Ion-Irradiated 4H—SiC p-n Junctions," *Materials* 14, published Apr. 14, 2021, 16 pages.
Sciuto et al., "4H—SiC p-n Junction-Based Near IR Photon Source," *IEEE Sensors Journal* 21(2):1504-1509, Jan. 15, 2021.
Wang et al., "Efficient Generation of an Array of Single Silicon-Vacancy Defects in Silicon Carbide," *Physical Review Applied* 7(064021), 2017, 6 pages.

* cited by examiner

LIGHT-EMITTER DEVICE WITH INDUCED DEFECTS AND METHOD OF MANUFACTURING THE LIGHT EMITTER DEVICE

BACKGROUND

Technical Field

The present disclosure relates to a light-emitter device and to a method of manufacturing the light-emitter device.

Description of the Related Art

As is known, photonic technologies are becoming increasingly widespread in everyday life. After decades of fast progress, light sources, in particular lasers and light-emitting diodes, have become having high performance, but low cost and high reliability components, at the basis, for example, of Internet operation and urban lighting.

A new frontier of research is the development of non-classic light sources, such as low power sources able to produce photon flows with controllable emission rate, fast decay (few nanoseconds), and a clearly defined spectral bandwidth. In particular, robust and inexpensive light sources able to emit single photons on demand are at the center of many highly demanding optical technologies.

The possibility of providing devices able of emitting single photons has been demonstrated for various systems, including atoms, ions, molecules, and quantum dots (QD), many of which operate at cryogenic temperatures and in high inhomogeneity conditions and their use on a wide scale is thus impracticable.

For example, SiC-based single-photon sources have been devised, characterized by a very low light emission in NIR range and multiple wavelength bands emission in VIS and NIR.

A patent publication no. US 2020/0028001 and a scientific publication by Sciuto et al., "4H—SiC p-n Junction-Based Near IR Photon Source", IEEE Sensors Journal 2021, 21, 1504, doi:10.1109/JSEN.2020.3021587, propose a Single Photon Source based on SiC-based P-N junction device. In these works, the effects of Helium (He) irradiation on P-N junction photo-detectors are studied. In particular, the electro-optical performance of a device was monitored as a function of irradiation fluence, and changes in the optical measurements were correlated to the irradiation defects. He-ions irradiation is demonstrated to generate color centers and, at the same time, to quench undesired emission in the visible range.

The devices proposed according to the above-cited art are particularly useful in the context of single-photon NIR-field applications, in particular when a single-photon sensitive light detector or an optical detector operating at low temperatures is available.

Moreover, with reference to the manufacturing process of such devices (which foresees the use of ion implants to generate a localized defectiveness), there is the need to control the spatial position of the generated defects in the micron-scale range. Defects in semiconductors, introduced by irradiation with protons or ions, are used not only to generate light-irradiation centers, but also for the lifetime control of the charges.

BRIEF SUMMARY

The present disclosure is directed to overcoming the above-noted limitations, and in particular aims at obtaining photoemission from introduced color centers in engineered predefined and fixed sites of a P-N junction device with an improved process that reduces the number of the manufacturing steps; furthermore, the present disclosure is directed to introducing spatially-controlled defects during the manufacturing process of the device for various applications, for example charges lifetime control and/or current paths control and/or for the introduction of preferential recombination site(s) for charge carriers at fixed positions within the device.

In particular, the present disclosure relates to a light-emitter device and a method for manufacturing the light-emitter device, as defined in the annexed claims.

In one aspect, the present disclosure proposes a method to introduce defects and, consequently, energy levels, in the SiC bandgap through a controlled mechanical process. This approach is useful to reduce the number of operations/steps in the manufacturing workflow of an emitter device. Moreover the implemented methodology allows to control the spatial position of the generated defects in the micron-scale range.

BRIEF DESCRIPTION OF THE SEVERAL VIEWS OF THE DRAWINGS

For a better understanding of the present disclosure, embodiments thereof are now described, purely by way of non-limiting example, with reference to the attached drawings, wherein.

DETAILED DESCRIPTION

Figure 1:
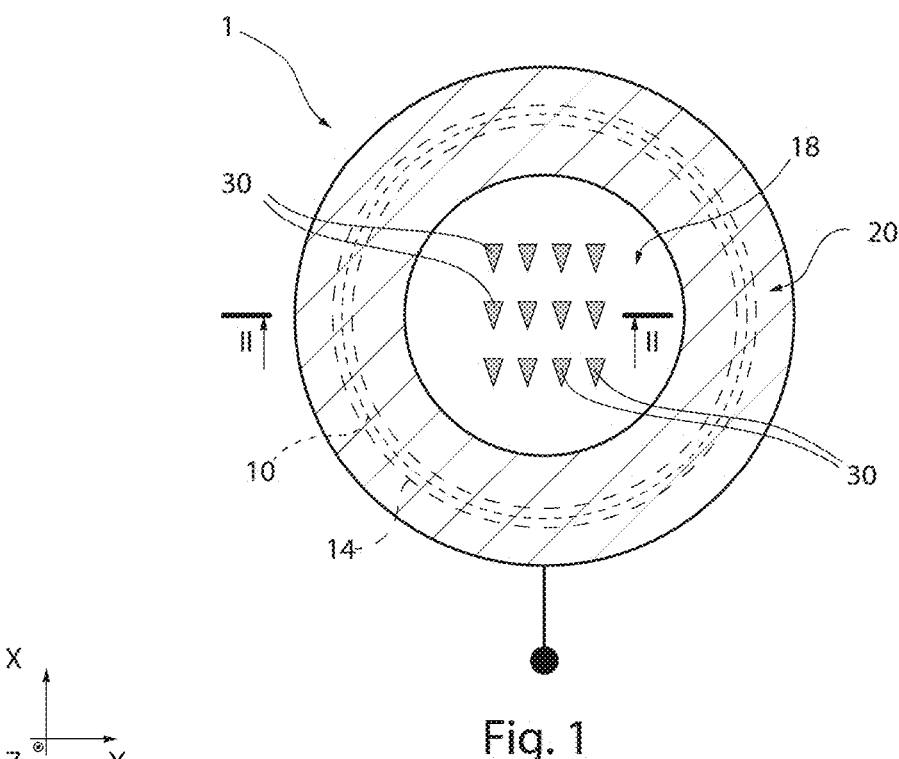
FIG. 1 shows a top-plan view of a light-emitting device according to an embodiment of the present disclosure.

FIG. 1 shows, in a top-plan view, a device 1 according to an aspect of the present disclosure. The device 1 is shown in a triaxial coordinates system of axis X, Y, Z orthogonal to one another. The top-plan view of FIG. 1 is on the XY plane.

Figure 2:
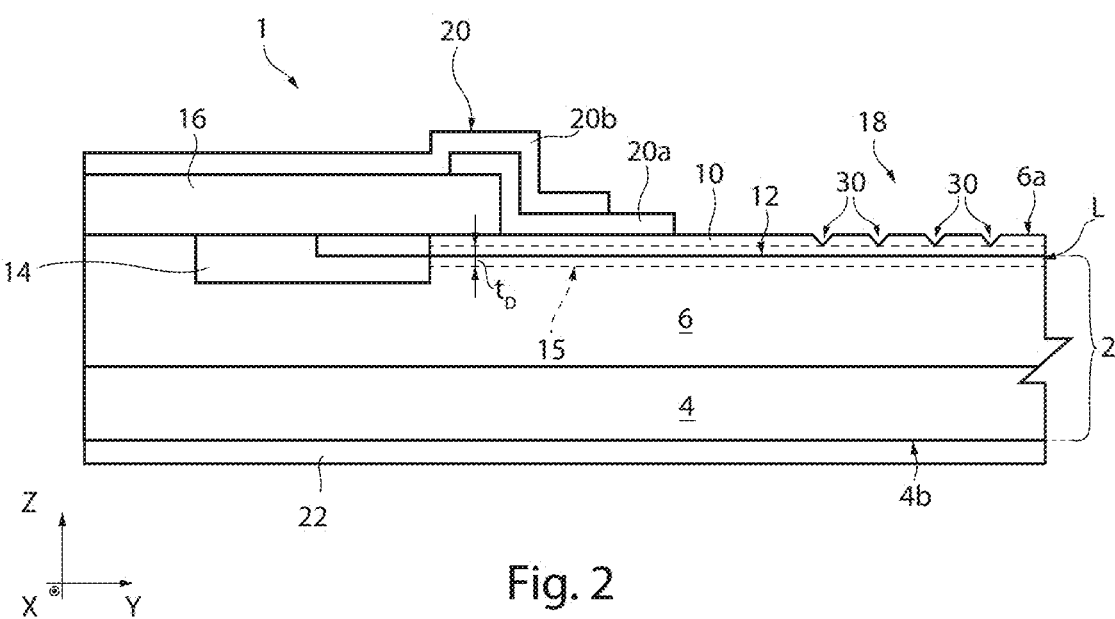
FIG. 2 shows the light-emitting device of FIG. 1 in a cross section view along the cut line II-II of FIG. 1.

FIG. 2 shows a portion of the device 1 of FIG. 1 in a cross section view on the YZ plane, taken along the cut line II-II of FIG. 1.

The device 1 is, in particular, an emitter device and, more precisely, a light-emitter device configured to emit light in the visible range and/or in the non-visible range (e.g., in the Near Infrared Range, NIR). With reference to FIGS. 1 and 2, the device 1 includes a P-N diode, more in particular a P-N photodiode.

The device 1 comprises a solid body 2, including for example a substrate 4 and an epitaxial layer 6 over the substrate 4. The solid body 2 is of a wide band-gap, solid-state, material having a band-gap greater than or equal to 2.3 eV, here Silicon Carbide (SiC), in particular of the 4H polytype of SiC (4H—SiC).

The substrate 4 is of an N+ type of conductivity and the epitaxial layer 6 is of an N-type of conductivity. For example, the substrate 4 has a doping level of about $1 \cdot 10^{19}$ at/cm$^3$; for example the epitaxial layer 6 has a doping level of $1 \cdot 10^{14}$ at/cm$^3$. For example, the thickness of substrate 4 is in the range of 30-600 μm (in particular 50-300 μm) and the thickness of the epitaxial layer 6 is in the range of 0.05-100 μm (in particular, 0.5-30 μm); however, it is apparent that other thickness values are possible and within the scope of the present disclosure.

The solid body is delimited by a front side 6a and by a rear side 4b, opposite to one another along the axis Z. In the embodiment of FIG. 2, the front side 6a belongs to the epitaxial layer 6 and the rear side 4b belongs to the substrate 4.

An anode region 10 extends at the front side 6a of the solid body 2, within the epitaxial layer 6. The anode region 10 is of P type and may be formed by implanting, within the solid body 2, P-type dopants (e.g., Aluminum) with a multiple implants at energies, for example, in the range of about 10 and 80 keV, with an implant with a dose comprised, for example, between $5 \times 10^{13}$ at/cm$^2$ and $1 \times 10^{14}$ at/cm$^2$, at a temperature of approximately 400° C. An annealing step is carried out for activating the implanted species, for example at a temperature of 1650° C. for 30 min in Argon environment. The anode region 10 is thus formed, and has a doping level of about $5 \cdot 10^{18}$ donors/cm$^3$.

The portions of the epitaxial layer 6 and substrate 4 of N-type form a cathode region of the device 1.

As a consequence of the above steps of manufacturing, a P-N junction 12 is formed by the P-type anode region 10 in direct contact with the N-type epitaxial layer 6 below the anode region 10. In the following, the reference numeral 12 identifies the metallurgical junction between P-type anode region and the N-type cathode region. In a non-limiting embodiment, the materials of the anode and cathode regions are the same (SiC), resulting in a so called homojunction; however, a heterojunction may also be formed according to a further embodiment.

When the N-type cathode region and the P-type anode region are formed adjacent to one another together, a density gradient exists between both sides of the P-N junction 12 thus formed, and a charge transfer of electrons and holes takes place across the junction 12, resulting in two depleted layers at both sides of the junction 12. This charge transfer is known as diffusion. The width (or thickness) along the Z axis of the depleted layers across the junction 12, resulting from the above-discussed diffusion process, depends on design parameters, including the doping doses of the N and P regions. A state of equilibrium (electrically neutral situation) occurs producing a "potential barrier" zone around the junction 12. Since no free charge carriers can rest in a position where there is a potential barrier, the depleted layers on either sides of the junction 12 become completely depleted of any more free carriers in comparison to the N and P type materials away from the junction 12. This depleted layers adjacent to and around the junction 12 are in the following called as a whole "depletion region" or "depleted region", identified with reference numeral 15. It is apparent that the depleted region is three-dimensional and may also be referred to as "depleted volume".

The depletion region 15 has a thickness $t_D$, along the Z axis, for example in the range of 30-100 nm (as function of design parameters). The "line" L represented in FIG. 2 corresponds to the interface between the anode region and the cathode region (i.e., the line L identifies the metallurgical junction 12). In an embodiment of the present disclosure, the depletion region 15 extends for about 20-25 nm above the line L (along the Z direction) and about 20-25 nm below the line L (along the Z direction). It is apparent that the thickness of the depletion region 15 may differ from the above-given range, and may be lower or higher according to design parameters (including implant dose, doping profile, etc.).

The anode region 10 has, in the top plan view of FIG. 1, a circular shape; however, other shapes may be selected, such as oval, squared, quadrangular, quadrangular with rounded corners, polygonal and the like.

An optional guard ring 14 surrounds the anode region 10. In the embodiment shown, the guard ring 14 has an annular shape (ring shape), has a conductivity of P-type, and extends around and contiguous to the anode region 10. The guard ring 14 has a doping level lower than that of the anode region 10, for example of about $1 \cdot 10^{17}$ at/cm$^3$, a maximum depth greater than the anode region 10 and may be formed by implanting Aluminum or Boron dopant species.

The front side 6a is partially covered with a protective layer 16, for example of dielectric such as Silicon Oxide or TEOS. The protective layer 16, also known as field-oxide layer, extends above the guard ring 14 (when present) and exposes a central portion of the device 1 (corresponding to an active area 18 of the device 1). In other words, in the top view of FIG. 1, the protective layer 16 has an annular shape (ring shape) and only partially covers the anode region 10 at lateral portions of the anode region 10, leaving an open window above the anode region 10 and thus delimiting (in a top-plan view) the active area 18 of the device 1. The active area 18 is, in the context of the present disclosure, the region of the device 1 where emission of light radiation occurs and includes the depletion region 15.

An anode-contact region 20 further extend above the field-oxide layer 16 and above the anode region 10. For instance, a metal layer, for example of Nickel or Titanium or another metal configured to form a ohmic contact, with a thickness of approximately 200 nm, is deposited by sputtering on the front side 6a and then selectively removed using a suitable mask, for example by wet etch, and a thermal treatment is carried out, for example a rapid thermal annealing (RTA) at 650° C. for 60 s in nitrogen environment, to promote the nickel silicide formation in the region covering the Silicon Carbide. This first metal layer 20a is in direct contact with the anode region 10. The first metal layer 20a (being of nickel and nickel silicide) extends partially on the field-oxide layer 16 and partially on the front side 6a, only partially covering the anode region 10. Therefore, the active area 18 is only partially covered by the first metal layer 20a. A second metal layer 20b, for example of Aluminum or of a multilayer of high conductive metals, is formed on the first metal layer 20a and on the field-oxide layer 16, and is not in direct contact with the anode region 10.

The function of the first metal layer 20a is to form the ohmic anodic contact; the function of the second metal layer 20b is to form the electrical contact metal pad.

As shown in the top plan view of FIG. 1, the anode-contact region 20 has an annular (ring-like) shape extending along the edge of the window delimited by of the field-oxide layer 16, over the field-oxide layer 16, in direct electrical contact with part of the anode region 10.

A cathode-contact terminal 22 of conductive material, in particular metal such as for example Nickel Silicide, is formed at the rear side 4b of the solid body 2, for example, by deposition and thermal treatment in N2 ambient of Nickel layer.

According to an aspect of the present disclosure, the device 1 comprises, in correspondence of the active area 18, and in particular at the front surface 6a internally delimited by the field-oxide layer 16 and by the anode-contact region 20, at least one indentation 30. FIGS. 1 and 2 show a plurality of indentations 30, in particular arranged in a matrix (e.g., a matrix of 15×15 indentations 30), according to an aspect of the present disclosure.

In one embodiment, one or more (e.g., all) indentations 30 extend from the side 6a through part of the epitaxial layer 6, within the anode region 10, and terminate before reaching the depletion region 15 (outside the depletion region 15). None of the indentations 30 crosses or traverses completely the depletion region 15.

In another embodiment, at least one indentation 30 reaches the depletion region 15 and terminates within the depletion region 15, without passing throughout the depletion region 15.

In one exemplary and non-limiting embodiment, the junction 12 (represented by the line L in FIG. 2) may be at a depth, measured from the front side 6a along the Z axis, of about 175 nm; accordingly, the depletion region 15 may extend from a minimum depth of 155 nm to a maximum depth of 195 nm (with the assumption that the depletion region 15 has a thickness $t_D$ of 40 nm along the Z axis).

Each indentation 30 is formed, in one embodiment of the present disclosure, by means of an indenter device or indenter system, in particular a nanoindenter, whose working principle is known in the art.

Nanoindentation is a method typically used to quantitatively measure sample's mechanical properties, such as elastic modulus and hardness. During the nanoindentation, a nanoindenter capable of determining the loading force (and, in certain cases, also displacement) is used.

The nanoindenter includes a tip, which has known geometry and known mechanical properties. Typically, the indentation tip is at a distal end of the indenter and, during use, the tip is forced into a sample of a material and then extracted therefrom, leaving an indentation (mold or perforation) in the surface of the sample. Known nanoindentation devices use optical imaging to determine the location of the indentation. For a more precise positioning of the indentation tip within a few nanometers, some nanoindentation instruments can scan the indentation tip over the surface, thereby creating a detailed image of the surface topology with nanometer-level resolution. This image can be subsequently used to precisely define the location for the indentation step.

According to an aspect of the present disclosure, the indentation tip of a nanoindenter is employed to generate the plurality of indentations 30 in correspondence of the active area 18. To produce an indentation within the 4H—SiC material, a load, for example, in the range of 0.5-50 mN (according to the device design parameters) may be applied by the tip onto the surface 6a. The actual value of the load depends upon the maximum depth that the indentation 30 should reach (by design). In general, since the present disclosure is not limited to solid body 2 in SiC, the force applied by the tip is chosen based on the mechanical characteristics of the material of the solid body 2, in particular such that the breaking limit of the material is reached; in this way, an indentation 30 is produced with the desired depth, and an amount of stress of the crystallographic structure is localized within the depletion region 15.

In one non-limiting embodiment, the present disclosure foresees the use of a tip of the so called Berkovich type. In general, in the context of the present invention, other available geometries for the tip may be employed, such as three sided pyramids, four sided pyramids, wedges, cones, cylinders, flat punches or spheres. The tip end can be sharp, flat, cylindrical or spherical. Diamond and sapphire are preferable materials for the tip, in particular to form indentations in SiC, but other hard materials can also be used such as quartz, tungsten, steel, tungsten carbide and almost any other hard metal or ceramic.

Figures 3, 4:
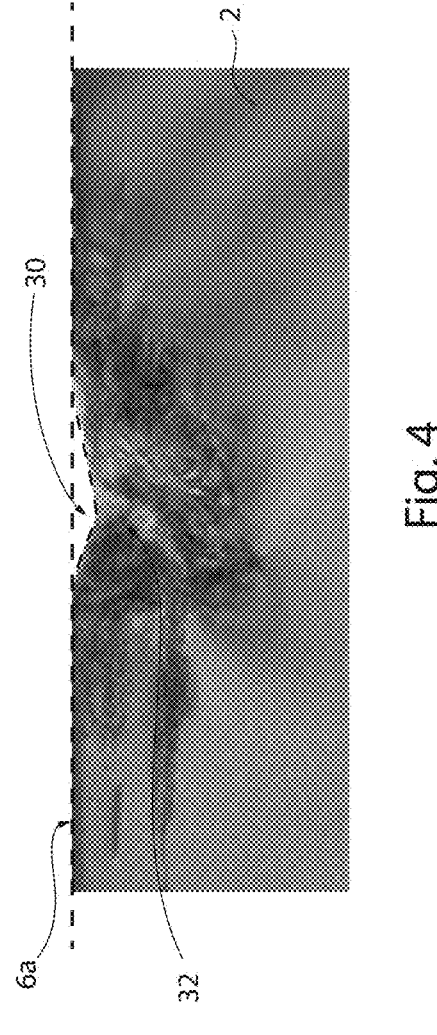
FIG. 3 shows in top-plan view, an indentation footprint on the surface of the light-emitting device of FIG. 1, according to an embodiment of the present disclosure.
FIG. 4 shows, in a cross-sectional view, an enlarged portion of the light-emitting device of FIG. 2 in correspondence of one indentation footprint.

FIG. 3 shows a top-plan view of an exemplary indentation 30 made with a nanoindenter employing a diamond tip having a Berkovich-type shape, according to an aspect of the present invention. By applying a load of about 15 mN at the front side 6a of the 4H—SiC solid body 2, the maximum penetration along the Z axis of the indentation 30 is about 155 nm. Smaller amounts of loads lead to corresponding shallower penetrations.

FIG. 4 shows a cross section exemplary view of the solid body 2 at the indentation 30, below the surface of the front side 6a. As can be appreciated, a defectiveness area 32 is present adjacent to, below, and around the indentation 30. In other words, by generating the physical, macroscopical, indentation 30, a defectiveness area 32 is formed by direct consequence in the depleted region 15, in particular adjacent and contiguous to the junction 12. The defectiveness area 32 extends from the indentation 30 in all directions, up to a maximum distance from the indentation 30 of about 1-2 μm. The defects in the defectiveness area 32 are at a higher concentration with respect to mean values of defects in a corresponding portion of the solid body 2 without indentations.

The deformation caused by the impact of the nanoindenter tip generates a stress in the solid body 2 and a number of defects in the reticular crystalline structure (lattice) of the solid body 2 at the indentation site. The energy band structure of the solid body 2 at the indentation site is consequently modified due to energy levels related to the indentation-related defects in a like manner as during the prior art methodology for generating a defective area by means of ionic implants, but without the need for the masking/implanting/cleaning steps of the known methodology.

The method of forming indentations 30 according to the present disclosure generates a greater variety of defects than the ionic implantation. The following are defects that may be generated (not all of the following defects may appear together in a same sample):

Point defects, which are defects that occur at or around a single lattice point, and include vacancies, interstitial defects, substitution defects, topological defects; point defects usually result in luminescence centers or color centers.

Line defects, or linear defects, include dislocations and disclinations.

Planar defects (e.g., different stacking sequences of close-packed crystals).

Bulk defects, including three-dimensional defects (such as pores, cracks) and voids (regions where there are no atoms, and which can be thought of as clusters of vacancies).

Other defects, not listed above, may be present, resulting in a plurality of color or luminescence centers.

The Applicant found that the effects of the present disclosure can be achieved by varying the tip shape, as long as the tip allows to reach, in the depletion region 15, a peak of tensile or compressive stress. As said, in order to reach the required stress, it is not required that the tip actually reaches the depletion region 15; only the peak of the generated stress should be localized within the depletion region 15.

The device 1 is designed to operate in forward-biasing condition. The emitter device 1, operating in LED mode, emits light by electroluminescence and has an emission peak at a wavelength of approximately 480-500 nm due to defects intrinsically present in the semiconductor or introduced by the device fabrication processes. The Applicant verified that the emitter device 1 also has a non-negligible emission at wavelengths between 600 nm and 1000 nm, with a further peak at 700-800 nm. This emission can be attributed to the above-discussed defects in the crystalline structure, obtained as a consequence of the formation of the indentations 30.

Figure 5:
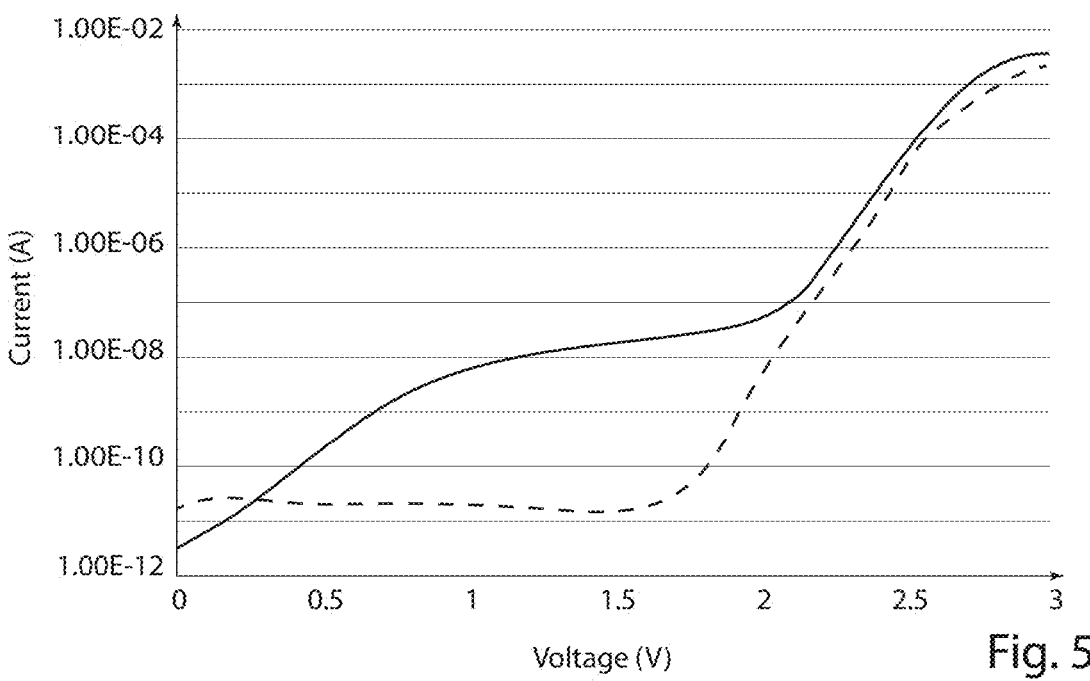
FIG. 5 shows current-voltage characteristic, or I-V curves, in forward polarization condition, comparing the light-emitting device of the present disclosure with a p-n junction device without intentionally introduced defects.

FIG. 5 shows the current-voltage characteristic of the device 1 in forward polarization condition. The forward I-V characteristic of the device 1 with and without indentations 30 are shown in FIG. 5 with solid line and dashed line, respectively, for comparison. Relevant modifications are observable in the forward characteristics after forming indentations 30: as expected, the diode without indentations 30 exhibits the typical behavior with an exponential increase in current at low voltage and a linear increase at higher voltages due to the onset of the series resistance. The forward characteristics changed after forming the indentations 30: the diode after the indentation still shows a rectifying behavior, but the direct I-V characteristic suggests the formation of low voltage extra-current correlated to defects introduced by the indentations, similar to what happens in devices of the same type that have defects caused by processing or introduced by ion irradiation (such as, for example, described in literature by Pellegrino et al., "Correlation between Defects and Electrical Performances of Ion-Irradiated 4H—SiC p-n Junctions", Materials 2021, 14, 1966; as well as described in US 2020/0028001)).

Figure 6:
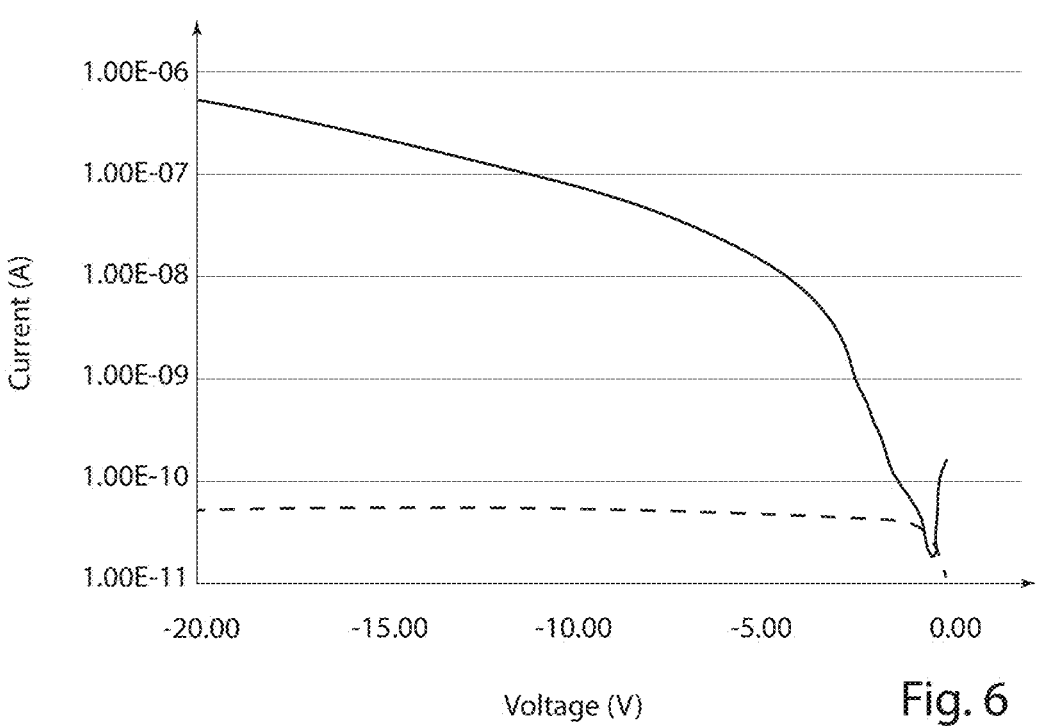
FIG. 6 shows current-voltage characteristic, or I-V curves, in reverse polarization condition, comparing the light-emitting device of the present disclosure with a p-n junction device without intentionally introduced defects.

FIG. 6 shows the current-voltage characteristic of the device 1 in reverse polarization condition. The reverse I-V characteristic of the device 1 with and without indentations 30 are shown in FIG. 6 with solid line and dashed line, respectively, for comparison. As may be noted, the reverse current assumes very low values in the diode without indentations and relevant leakage current is observable in diode with indentations, as expected due to induced defects.

Figure 7:
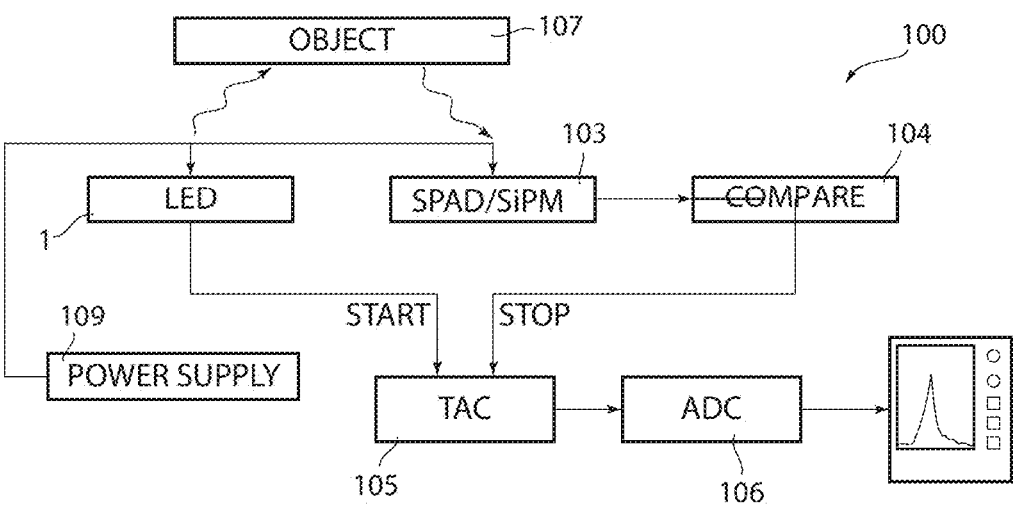
FIG. 7 is a block diagram of a proximity sensor that includes the light-emitting device of the present disclosure.
Figure 8:
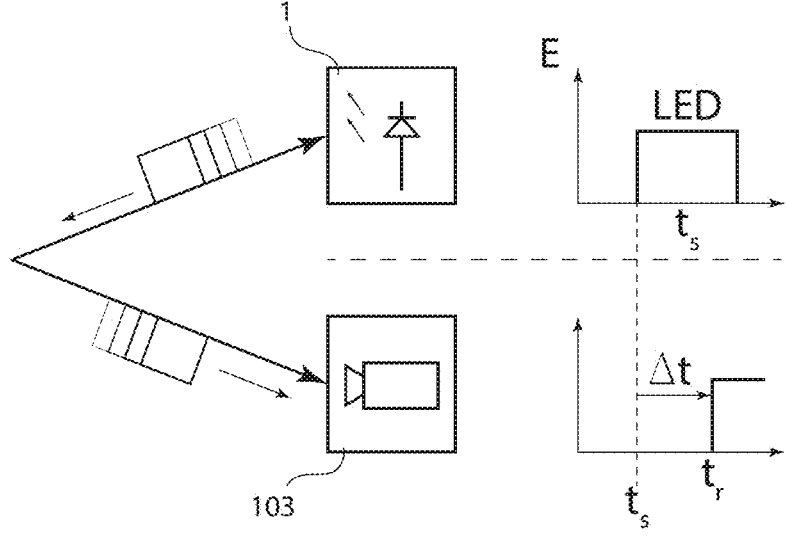
FIG. 8 shows the operating mode of some components of the sensor of FIG. 7.

The light-emitter device 1 may be employed in a variety of application. FIGS. 7 and 8 provide a non-limiting embodiment of an application of the device 1 of the present disclosure.

FIG. 7 shows the structure of a known proximity sensor, which measures the time taken by light to follow a preset path (also known as "time-of-flight sensor"), which can be used in a wide range of applications, for example for reconstruction of three-dimensional surfaces.

The proximity sensor of FIG. 7, designated as a whole by 100, comprises the light emitter device 1 of the present disclosure; a light receiver 103, for instance an avalanche photodiode operating in Geiger mode, also known as SPAD (Single-Photon Avalanche Diode, for example as described in the US patent application 2014/0339398) or a SiPM (Silicon PhotoMultiplier), formed by an array of SPADs, and outputting a sensing signal s1; a comparator 104, comparing the sensing signal s1 generated by the light receiver 103 with a threshold and outputting a stop signal s2; a time-to-amplitude converter (TAC) 105, receiving a trigger signal sT from the light emitter device 1 and the stop signal s2; and an analog-to-digital converter 106, connected to the output of the time-to-amplitude converter 105. A power supply 109 supplies the blocks of the proximity sensor 100.

In the proximity sensor 100 (see also the simplified diagram of FIG. 8), the light emitter device 1 emits the light radiation L1 towards an object 107, the distance whereof is to be determined, and simultaneously emits the trigger signal sT. The light radiation reflected by the object 107 (designated by L2) is detected by the light receiver 103, which causes generation of the stop signal s2 by the comparator 104 (for example, a CFD—Constant-Fraction Discriminator). The time-to-amplitude converter 105 (for example, a counter) generates a distance signal sD, which, after digitization, can be displayed on a screen 108.

The above diagram is based on the use of a driver circuit for driving the light emitter device 1 implemented in CMOS technology and such as to enable the light emitter device 1 to generate light in short times, with high energy and sufficient precision. However, other circuits may be used, for example integrated in the same chip as the light emitter device 1.

Finally, it is clear that modifications and variations may be made to the optical sensor and to the manufacturing method described and illustrated herein, without thereby departing from the scope of the present disclosure.

For example, the described various embodiments may be combined so as to provide further solutions.

Moreover, the solid body 2, in particular the epitaxial layer 6, may be any solid-state material of the wide-band-gap type, such as gallium nitride (AlGaN) or other materials.

Moreover, the anode region may be formed by implanting P-type dopant species in the N-type solid body 2 (cathode region), or by growing a further P-type epitaxial layer on an underlying N-type substrate (here, the substrate 4) or on an N-type epitaxial layer (here, the epitaxial layer 6).

In a further embodiment, the anode region has a N-type conductivity and the solid body 2 (cathode region) has a P-type conductivity.

Moreover, in a way not shown in the drawings, a protection layer may be formed above the front side 6a, in particular of a material that is transparent to the radiation emitted by the device during use (or of a material acting as a filter for some frequencies, if so is desired). A package can also be provided to house and protect the device 1.

A light-emitter device (1) may be summarized as including: a body (2) of solid-state material; and a P-N junction (12, 15) in the body (2), including: a cathode region (4, 6), having a conductivity of N-type; an anode region (10), having a conductivity of P-type, extending in direct contact with the cathode region (4, 6) and defining a light-emitting surface (6a); and a depletion region (15) around an interface (L) between the anode and the cathode regions, characterized in that the light-emitting surface (6a) has at least one indentation (30) that extends towards the depletion region (15), wherein the depletion region (15) has a peak defectiveness area (32), housing irregularities in crystal lattice, in correspondence of said at least one indentation (30).

Said irregularities may include one or more among: point defect, line defect, bidimensional or planar defect, tridimensional or bulk defect.

Said irregularities may include one or more among: vacancies, interstitial defects, dislocations, pores, voids, cracks.

Said irregularities may generate color centers configured to emit, light radiations at respective wavelengths.

The defectiveness area (32) may extend within the body (2) adjacent to, below, and laterally to said indentation (30).

The defectiveness area (32) may have a concentration of lattice defects higher than mean values of lattice defects that the depletion region (15) would have if said indentation (30) would not be present.

Said at least one indentation (30) may extend through the anode region (10) along a direction (Z) orthogonal to the light-emitting surface (6*a*).

Said at least one indentation (30) may extend through at least part of the anode region (10) and terminates before the interface between the anode region (10) and the cathode region (4, 6).

Said at least one indentation (30) may extend through part of the anode region (10) and terminates before reaching said depletion region (15).

The device may further include an active area (18) where emission of light radiation occurs, wherein said defectiveness area (32) extends in correspondence of the active area (18).

The device may further include a plurality of indentations (30) arranged in a matrix with said at least one indentation (30), each one of said plurality of indentations (30) extending from the light-emitting surface (6*a*) towards said depletion region (15), wherein the depletion region (15) has a respective plurality of peak defectiveness areas (32), housing irregularities in crystal lattice, in correspondence of each of said indentations (30) of the plurality of indentations (30).

The body (2) of solid-state material may have a band gap greater than or equal to 2.3 eV.

The solid-state material may be Silicon Carbide, SiC, in particular of the 4H polytype of SiC.

The anode region (10) may extend in the solid body (2), said light-emitting surface (6*a*) being a surface of the solid body (2) at which the anode region (10) extends.

A method of manufacturing a light-emitter device (1), may be summarized as including the steps of: providing a body (2) of solid-state material; forming a P-N junction (12, 15) in the body (2), including the steps of: forming a cathode region (4, 6), having N-type conductivity; and forming an anode region (10), having P-type conductivity, in direct contact with the cathode region (4, 6), thereby causing the formation of a depletion region (15) around an interface (L) between the anode and the cathode regions, the anode region (10) defining a light-emitting surface (6*a*), characterized in that said method includes the further step of forming, at the light-emitting surface (6*a*), at least one indentation (30) that extends towards the depletion region (15), thereby generating a peak defectiveness area (32), housing irregularities in crystal lattice, in the depletion region (15) in correspondence of said at least one indentation (30).

The step of forming the at least one indentation (30) may include applying a load at said light-emitting surface (6*a*) by means of a tip of an indenter or nanoindenter system.

Said load may be designed such that: the at least one indentation (30) extends through at least part of the anode region (10) and terminates before the interface between the anode region (10) and the cathode region (4, 6); or the at least one indentation (30) extends through part of the anode region (10) and terminates before reaching said depletion region (15).

Said load may be designed such that a peak of tensile or compressive stress is reached in the depletion region (15).

The body (2) may be of Silicon Carbide and said load is in the range 3-15 mN.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light-emitter device comprising:
   a body of solid-state material; and
   a P-N junction in the body, including:
   a cathode region, having a conductivity of N-type;
   an anode region, having a conductivity of P-type, extending in direct contact with the cathode region and defining a light-emitting surface; and
   a depletion region around an interface between the anode and the cathode regions,
   wherein the light-emitting surface has at least one indentation that extends towards the depletion region,
   wherein the depletion region has a peak defectiveness area, housing irregularities in crystal lattice, in correspondence of the at least one indentation.

2. The device according to claim 1, wherein the irregularities include one or more among: point defect, line defect, bidimensional or planar defect, tridimensional or bulk defect.

3. The device according to claim 1, wherein the irregularities include one or more among: vacancies, interstitial defects, dislocations, pores, voids, cracks.

4. The device according to claim 1, wherein the irregularities generate color centers configured to emit, light radiations at respective wavelengths.

5. The device according to claim 1, wherein the defectiveness area extends within the body adjacent to, below, and laterally to the indentation.

6. The device according to claim 1, wherein the defectiveness area has a concentration of lattice defects higher than mean values of lattice defects that the depletion region would have if the indentation would not be present.

7. The device according to claim 1, wherein the at least one indentation extends through the anode region along a direction orthogonal to the light-emitting surface.

8. The device according to claim 1, wherein the at least one indentation extends through at least part of the anode region and terminates before the interface between the anode region and the cathode region.

9. The device according to claim 1, wherein the at least one indentation extends through part of the anode region and terminates before reaching the depletion region.

10. The device according to claim 1, further comprising an active area where emission of light radiation occurs, wherein the defectiveness area extends in correspondence of the active area.

11. A device, comprising:
    a body of solid-state material; and a P-N junction in the body, including:

a cathode region, having a conductivity of N-type;

an anode region, having a conductivity of P-type, extending in direct contact with the cathode region;

a light-emitting surface on the anode region; and a depletion region around an interface between the anode and the cathode regions, at least one indentation that extends towards the depletion region in the light-emitting surface;

a peak defectiveness area in the depletion region that includes irregularities in crystal lattice, in correspondence of the at least one indentation; and a plurality of indentations in a matrix with the at least one indentation, each one of the plurality of indentations extending from the light-emitting surface towards the depletion region, the depletion region has a respective plurality of peak defectiveness areas, including irregularities in crystal lattice, in correspondence of each of the indentations of the plurality of indentations.

12. The device according to claim 11, wherein the body of solid-state material has a band gap greater than or equal to 2.3 eV.

13. The device according to claim 11, wherein the solid-state material is Silicon Carbide, SiC, in particular of the 4H polytype of SiC.

14. The device according to claim 11, wherein the anode region extends in the solid body, the light-emitting surface being a surface of the solid body at which the anode region extends.

15. A method of manufacturing a light-emitter device, comprising:

forming a P-N junction in body of solid-state material, including:

forming a depletion region around an interface between an anode region and a cathode region, the anode region defining a light-emitting surface;

forming the cathode region having N-type conductivity; and forming the anode region having P-type conductivity and in direct contact with the cathode region:

generating a peak defectiveness area, housing irregularities in crystal lattice, in the depletion region in correspondence of at least one indentation by forming, at the light-emitting surface, the at least one indentation that extends towards the depletion region.

16. The method according to claim 15, wherein the forming the at least one indentation comprises applying a load at the light-emitting surface by a tip of an indenter or nanoindenter system.

17. The method according to claim 16, wherein the load is designed wherein:

the at least one indentation extends through at least part of the anode region and terminates before the interface between the anode region and the cathode region; or the at least one indentation extends through part of the anode region and terminates before reaching the depletion region.

18. The method according to claim 16, wherein the load is designed wherein a peak of tensile or compressive stress is reached in the depletion region.

19. The method according to claim 16, wherein the body is of Silicon Carbide and the load is in the range 3-15 mN.

* * * * *